United States Patent
Lee et al.

(10) Patent No.: US 9,590,171 B2
(45) Date of Patent: Mar. 7, 2017

(54) ELECTRONIC DEVICE AND METHOD FOR FABRICATING THE SAME

(71) Applicant: SK hynix Inc., Icheon-Si (KR)

(72) Inventors: Jin-Ho Lee, Icheon-Si (KR); Ki-Seon Park, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 334 days.

(21) Appl. No.: 14/212,814

(22) Filed: Mar. 14, 2014

(65) Prior Publication Data
US 2014/0281231 A1    Sep. 18, 2014

(30) Foreign Application Priority Data

Mar. 15, 2013 (KR) .......................... 10-2013-0027839

(51) Int. Cl.
*H01L 43/02* (2006.01)
*H01L 43/08* (2006.01)
*H01L 27/22* (2006.01)

(52) U.S. Cl.
CPC ............ *H01L 43/02* (2013.01); *H01L 27/224* (2013.01); *H01L 43/08* (2013.01)

(58) Field of Classification Search
CPC ..... H01L 27/22; H01L 27/222; H01L 27/224; H01L 27/226; H01L 27/228; H01L 43/02; H01L 43/08; G11C 11/14–11/16; G11C 11/161
See application file for complete search history.

(56) References Cited

U.S. PATENT DOCUMENTS

| | | | |
|---|---|---|---|
| 5,953,248 A * | 9/1999 | Chen | G11C 11/16 257/E27.005 |
| 6,677,631 B1 | 1/2004 | Drewes | |
| 7,989,224 B2 | 8/2011 | Gaidis | |
| 2011/0233697 A1* | 9/2011 | Kajiyama | G11C 11/16 257/421 |
| 2012/0161263 A1* | 6/2012 | Maat | B82Y 25/00 257/422 |
| 2013/0037892 A1* | 2/2013 | Park | H01L 43/12 257/421 |

* cited by examiner

*Primary Examiner* — Allison P Bernstein
(74) *Attorney, Agent, or Firm* — Perkins Coie LLP

(57) ABSTRACT

An electronic device in accordance with this technology includes semiconductor memory. The semiconductor memory may include a magnetization-pinned layer configured to include a first magnetic layer, a second magnetic layer, and a non-magnetic layer interposed between the first magnetic layer and the second magnetic layer, a free magnetization layer spaced apart from the magnetization-pinned layer, a tunnel barrier layer interposed between the magnetization-pinned layer and the free magnetization layer, and a magnetic spacer configured to come in contact with a side of the first magnetic layer and at least part of a side of the second magnetic layer.

22 Claims, 16 Drawing Sheets

ELECTRONIC DEVICE AND METHOD FOR FABRICATING THE SAME

CROSS-REFERENCE TO RELATED APPLICATIONS

This patent document claims priority of Korean Patent Application No. 10-2013-0027839, entitled "SEMICONDUCTOR DEVICE AND METHOD OF MANUFACTURING THE SAME, AND MICROPROCESSOR, PROCESSOR, SYSTEM, DATA STORAGE SYSTEM AND MEMORY SYSTEM INCLUDING THE SEMICONDUCTOR DEVICE," and filed on Mar. 15, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor and related electronic devices have been conducted. Examples of such semiconductor devices include semiconductor devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device. An electronic device disclosed in this patent document is capable of enhancing the exchange coupling of the magnetization-pinned layer of a variable resistance element. An electronic device disclosed in this patent document is also capable of preventing a stray magnetic field produced by the magnetization-pinned layer from affecting the free magnetization layer of the variable resistance element, thereby improving the magnetic resistance characteristic of the variable resistance element, by forming a magnetic spacer coming in contact with the magnetization-pinned layer but not coming in contact with the free magnetization layer.

In one aspect, an electronic device is provided to include a semiconductor memory that includes: a magnetization-pinned layer configured to include a first magnetic layer, a second magnetic layer, and a non-magnetic layer interposed between the first magnetic layer and the second magnetic layer, a free magnetization layer spaced apart from the magnetization-pinned layer, a tunnel barrier layer interposed between the magnetization-pinned layer and the free magnetization layer, and a magnetic spacer configured to come in contact with a side of the first magnetic layer and at least part of a side of the second magnetic layer. In another aspect, an electronic device is provided to include a semiconductor memory that includes a magnetization-pinned layer configured to include a first magnetic layer, a second magnetic layer, and a non-magnetic layer interposed between the first magnetic layer and the second magnetic layer, a free magnetization layer spaced apart from the magnetization-pinned layer, a tunnel barrier layer interposed between the magnetization-pinned layer and the free magnetization layer, and a magnetic spacer formed on at least a part of sidewalls of the magnetization-pinned layer.

In some implementations, the semiconductor memory further includes a capping layer configured to come in contact with a side of the free magnetization layer. In some implementations, the semiconductor memory further includes a capping layer formed on sidewalls of the free magnetization layer. In some implementations, the capping layer covers the magnetic spacers. In some implementations, the capping layer is placed under the magnetic spacer. In some implementations, the magnetic spacers are formed to cover sidewalls of the first magnetic layer and partially cover sidewalls of the second magnetic layer. In some implementations, the magnetic spacers are formed to cover at least part of sidewalls of the tunnel barrier layer. In some implementations, the magnetic spacers are formed to be free of contact with the free magnetization layer. In some implementations, the semiconductor memory further comprises an anti-ferromagnetic layer configured to come in contact with a first surface of the magnetization-pinned layer, wherein the first surface is on an opposite side of a second surface of the magnetization-pinned layer which faces the tunnel barrier layer. In some implementations, the magnetic spacer covers sides of the magnetization-pinned layer and the anti-ferromagnetic layer. In some implementations, the magnetic spacers are formed to cover sidewalls of the anti-ferromagnetic layer. In some implementations, the semiconductor memory further comprises a first conductive layer coupled with the magnetization-pinned layer, and a second conductive layer coupled with the free magnetization layer. In some implementations, the free magnetization layer comprises a lower magnetic layer, an upper magnetic layer, and a non-magnetic layer interposed between the lower magnetic layer and the upper magnetic layer.

In some implementations, a thickness of the non-magnetic layer is set to control an exchange coupling characteristic between the lower magnetic layer and the upper magnetic layer. In some implementations, the magnetic spacer includes ferromagnetic materials. In some implementations, the magnetic spacer shields a magnetic field from the magnetization-pinned layer. In some implementations, the magnetic spacer is spaced apart from the free magnetization layer.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method is provided for fabricating an electronic device including a semiconductor memory. The method includes: forming a variable resistance element configured to include a first magnetic layer, a non-magnetic layer, a second magnetic layer, a tunnel barrier layer, and a third magnetic layer sequentially stacked over a substrate; forming a magnetic layer for spacers over the variable resistance element; and forming a magnetic spacer on sidewalls of the first magnetic layer, the non-magnetic layer, and the second magnetic layer by etching the magnetic layer for spacers so that a side of the third magnetic layer is exposed. In some implementations, the method may further include forming a capping layer over the variable resistance element and the magnetic spacer after forming the magnetic spacer.

In another aspect, a method is provided for fabricating an electronic device including a semiconductor memory. The method includes: forming a variable resistance element configured to include a third magnetic layer, a tunnel barrier layer, a second magnetic layer, a non-magnetic layer, and a first magnetic layer sequentially stacked over a substrate; forming a capping layer on a side of the third magnetic layer; and forming a magnetic spacer on sidewalls of the second magnetic layer, the non-magnetic layer, and the first magnetic layer. In some implementations, the forming of the magnetic spacer may include forming a magnetic layer for spacers over the variable resistance element; and performing blanket etching on the magnetic layer for spacers.

In another aspect, a method is provided for fabricating an electronic device including a semiconductor memory. The method includes: forming a variable resistance element including a magnetization-pinned layer, a free magnetization layer, and a tunnel barrier layer; forming a magnetic layer to cover the variable resistance element; and patterning the magnetic layer to form a magnetic spacer to cover at least part of sidewalls of the magnetization-pinned layer and to expose the free magnetization layer without having a contact between the magnetic spacer and the free magnetization layer. In some implementations, the method further includes forming a capping layer to cover sides of the free magnetization layer and the tunnel barrier layer. In some implementations, the method further includes forming a capping layer to cover the entire variable resistance element including the magnetic spacer. In some implementations, the method further includes forming a capping layer to cover sidewalls of the free magnetization layer. In some implementations, the forming of the magnetic spacer includes performing blanket etching on the magnetic layer to form the magnetic spacer. In some implementations, the method includes forming the magnetization-pinned layer to include a first magnetic layer, a second magnetic layer, and a non-magnetic layer; and patterning the magnetic spacer to cover sidewalls of the first magnetic layer and partially cover sidewalls of the second magnetic layer.

In another aspect, an electronic device is provided to include a semiconductor memory that includes a substrate; and an array of memory cells over the substrate, each memory cell including a variable resistance element and a switching circuit element coupled to the variable resistance to select the variable resistance element, wherein each variable resistance element includes a stacked structure including a magnetization-pinned layer exhibiting a magnetization that is pinned to a fixed direction, a free magnetization layer separated from the magnetization-pinned layer and structured to exhibit a variable magnetization that is changeable in response to an applied control signal and a tunnel barrier layer interposed between the magnetization-pinned layer and the free magnetization layer, and wherein each variable resistance element further includes a magnetic spacer in contact with a side wall of the stacked structure, the magnetic spacer structured to cover at least part of the sidewall of the magnetization-pinned layer without being in contact with the free magnetization layer to provide shielding of the free magnetization layer from a stray magnetic field produced by the magnetization-pinned layer.

In some implementations, the switching circuit element in each memory cell includes a transistor. In some implementations, the switching circuit element in each memory cell includes a diode. In some implementations, the magnetic spacer has a varying thickness along the sidewall of the stacked structure. In some implementations, the free magnetization layer is closer to the substrate than the magnetization-pinned layer in each stacked structure, and the magnetic spacer is in contact with the substrate. In some implementations, the magnetization-pinned layer is closer to the substrate than the free magnetization layer in each stacked structure, and the magnetic spacer is free of a contact with the substrate.

These and other aspects, implementations and associated advantages are described in greater detail in the drawings, the description and the claims.

DETAILED DESCRIPTION

Figure 1A:
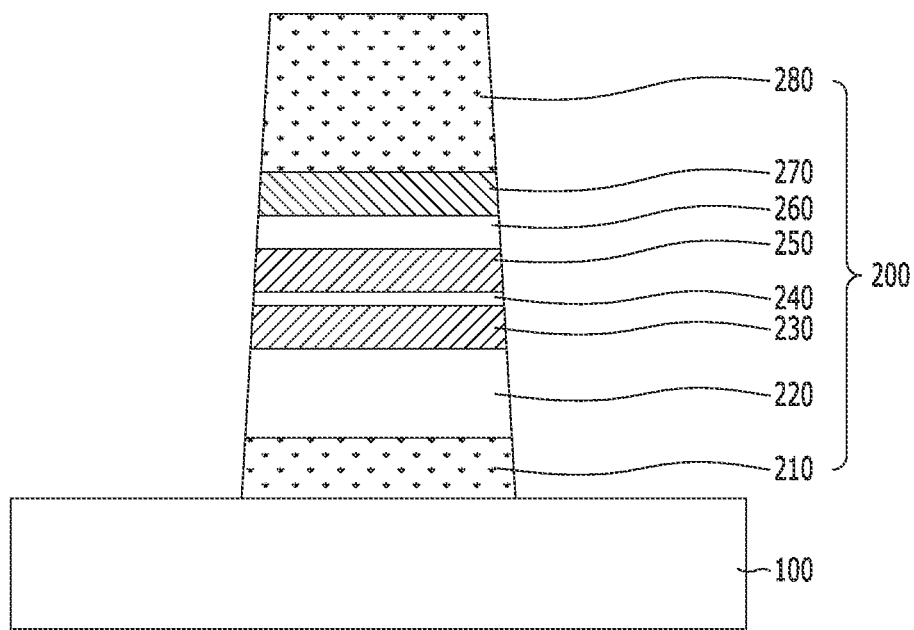
FIGS. 1A to 1C are cross-sectional views illustrating an example of a method for fabricating an example of a semiconductor device in accordance with a first implementation of the disclosed technology in this document.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
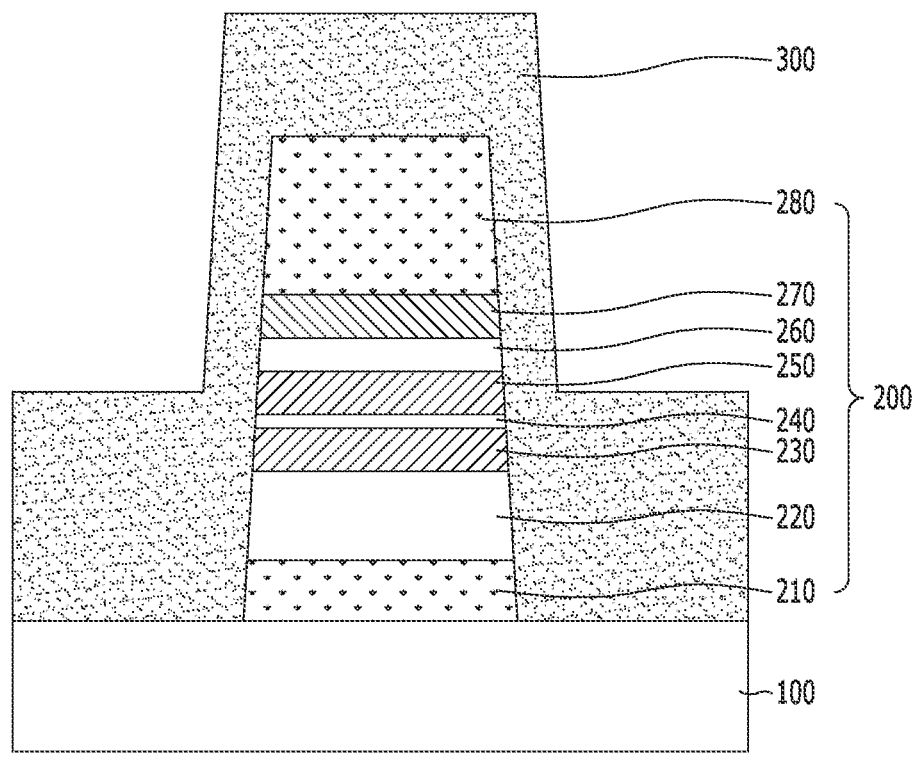
Figure 1C:
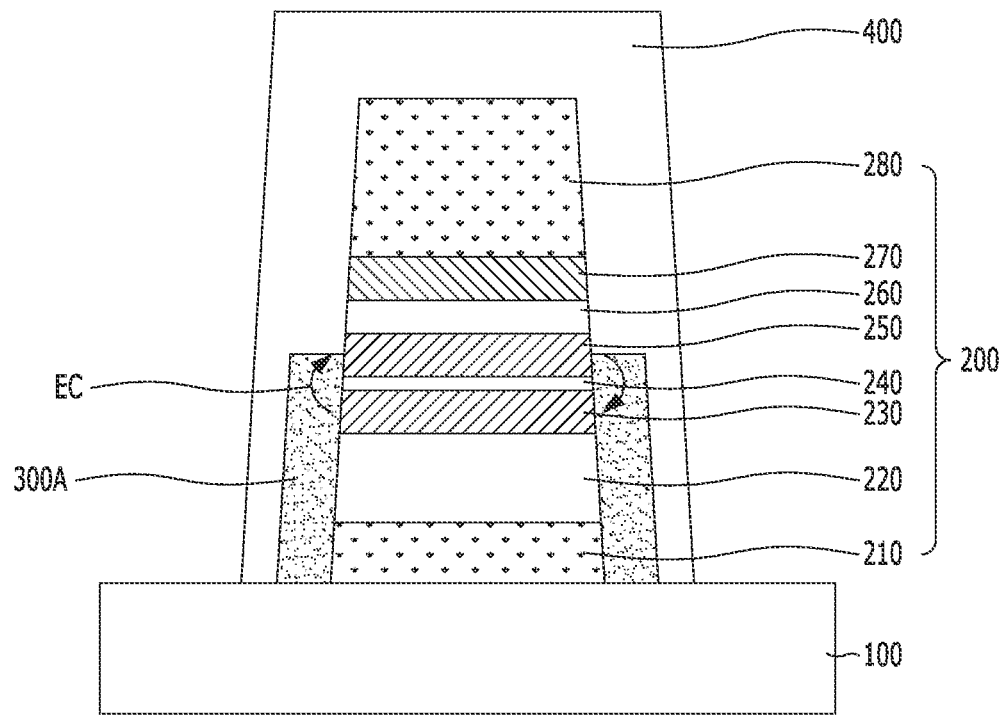

FIGS. 1A to 1C are cross-sectional views illustrating an example of a method for fabricating a semiconductor device based on the disclosed technology.

Referring to FIG. 1A, a variable resistance element 200 is formed over a substrate 100 to have a stack structure including a first conductive layer 210, an anti-ferromagnetic layer 220, a first magnetic layer 230, a non-magnetic layer 240, a second magnetic layer 250, a tunnel barrier layer 260, a third magnetic layer 270, and a second conductive layer 280 that are sequentially stacked over the substrate 100. The variable resistance element 200 may be formed by a patterning process including lithography and etching. An etching profile of the variable resistance element 200 may be vertical to the substrate 100, or the etching profile may have a positive or negative slope. Although only one variable resistance element 200 is illustrated in the figures, a plurality of the variable resistance elements 200 may be arrayed in a matrix form when viewed in a top view of the substrate 100.

The substrate 100 may be based on or include a semiconductor substrate, such as a silicon (Si) substrate, a germanium (Ge) substrate, a silicon-germanium (SiGe) substrate, or a silicon-on-insulator (SOI) substrate. Although not shown in the figures, the substrate 100 may include switching elements for selecting any one of the plurality of the variable resistance elements 200 and peripheral circuit elements for driving the switching elements.

The first conductive layer 210 may be a seed layer for forming upper structures such as the anti-ferromagnetic layer 220, and the second conductive layer 280 may be a capping layer for protecting underlying structures such as the third magnetic layer 270. Furthermore, the first conductive layer 210 and the second conductive layer 280 may function as electrodes and may include conductive materials capable of applying voltage or a current to the variable resistance element 200. For example, each of the first and the second conductive layers 210 and 280 may be a single layer, including metal, such as tantalum (Ta), titanium (Ti), ruthenium (Ru), hafnium (Hf), zirconium (Zr), aluminum (Al), tungsten (W), copper (Cu), gold (Au), silver (Ag), platinum (Pt), nickel (Ni), chrome (Cr), or cobalt (Co), or metal nitride, such as titanium nitride (TiN), tantalum nitride (TaN), or tungsten nitride (WN), or a multiple layer including a combination of them.

The first magnetic layer 230 and the second magnetic layer 250 may form a magnetization-pinned layer having a pinned magnetization direction. The third magnetic layer 270 may form a free magnetization layer having a variable magnetization direction that can switch its magnetization direction in response to an applied current or voltage. The first magnetic layer 230, the second magnetic layer 250, and the third magnetic layer 270 may include ferromagnetic materials, such as iron (Fe), nickel (Ni), cobalt (Co), gadolinium (Gd), or dysprosium (Dy), or an alloy of them, for example, cobalt-iron (CoFe), nickel-iron (NiFe), or cobalt-iron-nickel (CoFeNi). In order to improve the physical properties of the first, the second, and the third magnetic layers 230, 250, and 270, various elements may be added to the ferromagnetic materials and the alloys. For example, the first, the second, and the third magnetic layers 230, 250, and 270 may be made of or include cobalt-iron-boron (CoFeB) in which boron (B) has been added to cobalt-iron (CoFe). In addition to boron (B), one or more of tantalum (Ta), ruthenium (Ru), copper (Cu), gold (Au), titanium (Ti), chrome (Cr), silver (Ag), aluminum (Al), osmium (Os), rhenium (Re), carbon (C), oxygen (O), nitrogen (N), palladium (Pd), platinum (Pt), zirconium (Zr), zinc (Zn), iridium (Ir), tungsten (W), molybdenum (Mo), and niobium (Nb) may be added to cobalt-iron (CoFe). The first, the second, and the third magnetic layers 230, 250, and 270 may be made of or include the same material or different materials.

The anti-ferromagnetic layer 220 functions to stably pin the magnetization direction of a magnetization-pinned layer and may include anti-ferromagnetic materials such as platinum-manganese (PtMn), iridium-manganese (IrMn), nickel-manganese (NiMn), iron-manganese (FeMn), nickel oxide (NiO), cobalt oxide (CoO), iron oxide ($Fe_2O_3$), nickel chloride ($NiCl_2$), cobalt chloride ($CoCl_2$), or iron chloride ($FeCl_2$).

The combination of the non-magnetic layer 240, the first and the second magnetic layers 230 and 250 may be structured to form a magnetization-pinned layer. The first and the second magnetic layers 230 and 250 may be anti-ferromagnetically or ferromagnetically coupled with each other via the non-magnetic layer 240 interposed therebetween. The non-magnetic layer 240 may include non-magnetic and conductive materials, such as ruthenium (Ru), chrome (Cr), copper (Cu), titanium (Ti), tungsten (W), or tantalum (Ta). An exchange coupling (EC) characteristic between the first and the second magnetic layers 230 and 250 can be controlled by controlling the thickness of the non-magnetic layer 240.

The tunnel barrier layer 260 may include non-magnetic insulating materials capable of generating a tunneling magnetoresistance (TMR) phenomenon, for example, magnesium oxide (MgO), aluminum oxide ($Al_2O_3$), silicon oxide ($SiO_2$), bismuth oxide ($Bi_2O_3$), magnesium nitride (MgN), aluminum nitride (AlN), silicon nitride (SiN), magnesium fluoride ($MgF_2$), or calcium fluoride ($CaF_2$).

Referring to FIG. 1B, a magnetic layer 300 is formed over the substrate 100 on which the variable resistance element 200 has been formed and covers the variable resistance element 200. The magnetic layer 300 is provided to form a magnetic spacer for shielding a magnetic field and may be made of or include one or more ferromagnetic materials having a high magnetic permeability. The magnetic layer 300 may include, for example, iron (Fe), nickel (Ni), cobalt (Co), gadolinium (Gd), dysprosium (Dy), samarium (Sm), terbium (Tb), or neodymium (Nd). In particular, the magnetic layer 300 for forming a magnetic spacer may be deposited to have a thicker thickness at the lower part of the variable resistance element 200 than at the upper part of the variable resistance element 200 by controlling step coverage when depositing the magnetic layer 300.

Referring to FIG. 1C, in the illustrated implementation, the magnetic layer 300 is patterned to expose the top part of the variable resistance element 200 and to form a magnetic spacer 300A on a sidewall or on the sidewalls of the variable resistance element 200 to cover side surfaces of the first conductive layer 210, the anti-ferromagnetic layer 220, the first magnetic layer 230, the non-magnetic layer 240, and at least part of the second magnetic layer 250. The patterning of the magnetic layer 300 can be performed by, e.g., etching the magnetic layer 300 until the sides of the second conductive layer 280 and the third magnetic layer 270 are exposed to be free of contact with the magnetic layer 300. Since the lower part of the magnetic layer 300 for forming the magnetic spacer is thicker than the upper part of the magnetic layer 300 as described above, the magnetic spacer 300A may be formed only at the lower part of the variable resistance element 200 through blanket etching. In particular, the top of the magnetic spacer 300A is formed to be in contact with at least part of the second magnetic layer 250, but not to be in contact with the third magnetic layer 270. This configuration of the magnetic spacer 300A without contact with the third magnetic layer 270 is used to enhance exchange coupling (EC) between the first and the second magnetic layers 230 and 250 and to function as a magnetic shield to prevent a stray magnetic field from the first and the second magnetic layers 230 and 250 from affecting the third magnetic layer 270. Although the magnetic spacer 300A in the specific example in FIG. 1C are illustrated as not to be in contact with the tunnel barrier layer 260, the magnetic spacer 300A may be in contact with part of the tunnel barrier layer 260.

FIG. 1C further shows formation of a capping layer 400 on the variable resistance element 200 and the magnetic spacer 300A. The capping layer 400 may be formed to cover the magnetic spacer 300A and the upper part of the variable resistance element 200, that is, the second conductive layer 280, the third magnetic layer 270 and the tunnel barrier layer 260. The capping layer 400 may include nitride-series materials and protect the variable resistance element 200 and the magnetic spacer 300A in subsequent processes.

Referring to FIG. 1C, in the semiconductor device, the variable resistance element 200 is formed over the substrate 100 to have a stack structure including the first conductive layer 210, the anti-ferromagnetic layer 220, the first magnetic layer 230, the non-magnetic layer 240, the second magnetic layer 250, the tunnel barrier layer 260, the third magnetic layer 270, and the second conductive layer 280. The magnetic spacer 300A is configured to come in contact with the side of the first magnetic layer 230 and at least part of the side of the second magnetic layer 250. The capping layer 400 is configured to come in contact with the third magnetic layer 270.

In implementations of the device in FIG. 1C, the first magnetic layer 230, the second magnetic layer 250, and the non-magnetic layer 240 interposed between the first magnetic layer 230 and the second magnetic layer 250 may form a magnetization-pinned layer having a synthetic anti-ferromagnetic (SAF) layer structure. The third magnetic layer 270 spaced from the magnetization-pinned layer may function as a free magnetization layer. The magnetization-pinned layer, the free magnetization layer, and the tunnel barrier layer 260 interposed between the magnetization-pinned layer and the free magnetization layer may form a magnetic tunnel junction (MTJ) whose electrical resistance is changed by spin transfer torque (STT) or a magnetic field. Accordingly, the variable resistance element 200 may exhibit a variable electrical resistance that is changed by the magnetization direction of the third magnetic layer 270 having a variable magnetization direction. For example, the variable resistance element 200 may have a low resistance state when the second magnetic layer 250 and the third magnetic layer 270 have parallel magnetization directions and may have a high resistance state when the second magnetic layer 250 and the third magnetic layer 270 have anti-parallel magnetization directions.

The anti-ferromagnetic layer 220 under the magnetization-pinned layer functions to stably pin the magnetization direction of the magnetization-pinned layer and may include anti-ferromagnetic materials. The sides of the magnetization-pinned layer and the anti-ferromagnetic layer 220 may be covered by the magnetic spacer 300A. The magnetic spacer 300A is spaced apart from the third magnetic layer 270 without contact, and the magnetic spacer 300A may include ferromagnetic materials capable of shielding a magnetic field from the magnetization-pinned layer. In particular, the magnetic spacer 300A can enhance the exchange coupling (EC) of the magnetization-pinned layer and prevent a stray magnetic field, generated from the magnetization-pinned layer, from affecting the free magnetization layer, thereby being capable of improving a magnetic resistance characteristic of the variable resistance element 200.

The capping layer 400 may cover the magnetic spacer 300A and may include nitride-series materials. Furthermore, the first conductive layer 210 coupled with the magnetization-pinned layer through the anti-ferromagnetic layer 220 can be a seed layer that functions as a lower electrode. The second conductive layer 280 coupled with the free magnetization layer may be a capping layer that functions as an upper electrode. Although not shown in the figures, the substrate 100 may include a selection element electrically coupled with the variable resistance element 200, for example, a transistor capable of performing on/off operations or a diode though which an electric current flows only in one direction. In addition, the substrate 100 may further include an asymmetric tunnel barrier having a non-linear current-voltage characteristic, a metal-insulator transition (MIT) element whose electrical resistance is suddenly changed because the MIT element transits from an insulator to metal or from metal to an insulator due to a change of its crystal structure in a specific critical temperature or an ovonic switching element capable of switching at specific threshold voltage.

Figure 2:
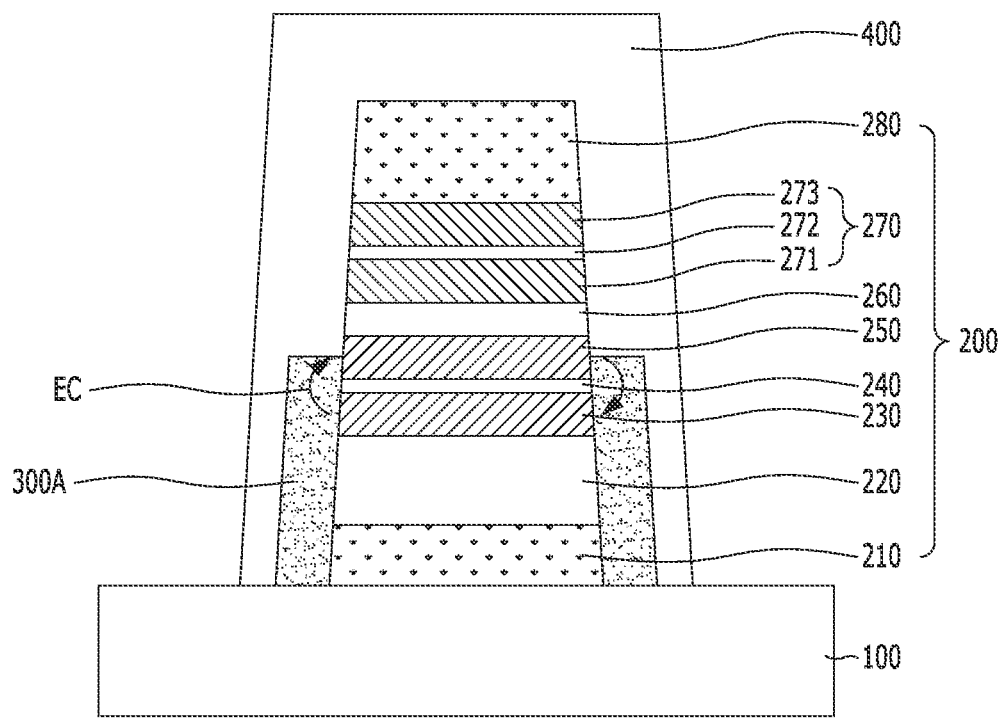
FIG. 2 is a cross-sectional view of an example of a semiconductor device in accordance with a second implementation of the disclosed technology in this document.

FIG. 2 is a cross-sectional view of a semiconductor device in accordance with a second implementation of the disclosed technology in this document.

Referring to FIG. 2, in the semiconductor device, a variable resistance element 200 is formed over a substrate 100 to have a stack structure of a first conductive layer 210, an anti-ferromagnetic layer 220, a first magnetic layer 230, a non-magnetic layer 240, a second magnetic layer 250, a tunnel barrier layer 260, a lower magnetic layer 271, a non-magnetic layer 272, an upper magnetic layer 273, and a second conductive layer 280. Magnetic spacer 300A is formed to contact with the sidewalls of the first conductive layer 210, the anti-ferromagnetic layer 220, the first magnetic layer 230, the non-magnetic layer 240, and at least part of side surfaces of the second magnetic layer 250. A capping layer 400 is formed to cover the variable resistance element 200 and the magnetic spacer 300A.

The lower magnetic layer 271, the upper magnetic layer 273, and the non-magnetic layer 272 interposed between the lower magnetic layer 271 and the upper magnetic layer 273 may form a third magnetic layer 270 having a synthetic anti-ferromagnetic (SAF) layer structure. The third magnetic layer 270 may function as a free magnetization layer. The lower magnetic layer 271 and the upper magnetic layer 273 may include the above-described ferromagnetic materials or alloys, and the lower magnetic layer 271 and the upper magnetic layer 273 may be coupled anti-ferromagnetically or ferromagnetically. Furthermore, the non-magnetic layer 272 may include the above-described non-magnetic and conductive materials. An exchange coupling characteristic between the lower magnetic layer 271 and the upper magnetic layer 273 can be controlled by controlling the thickness of the non-magnetic layer 272.

Figure 3:
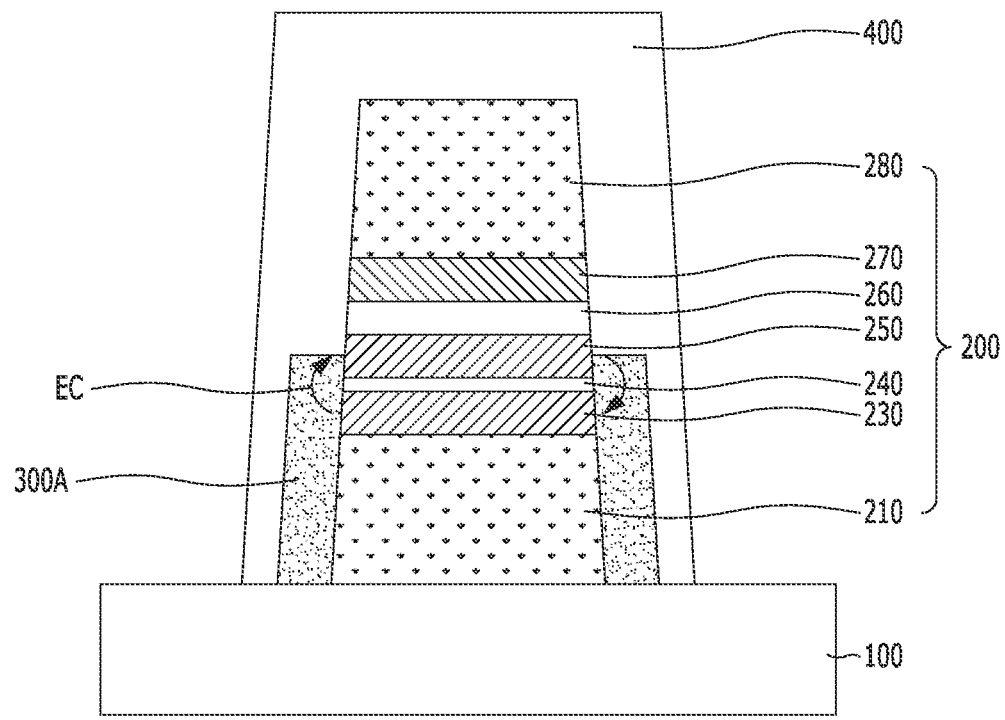
FIG. 3 is a cross-sectional view of an example of a semiconductor device in accordance with a third implementation of the disclosed technology in this document.

FIG. 3 is a cross-sectional view of a semiconductor device in accordance with a third implementation of the disclosed technology in this document. This semiconductor device may include a variable resistance element 200 configured to have a first conductive layer 210, a first magnetic layer 230, a non-magnetic layer 240, a second magnetic layer 250, a tunnel barrier layer 260, a third magnetic layer 270, and a second conductive layer 280 sequentially stacked over a substrate 100, magnetic spacer 300A configured to come in contact with the sidewalls of the first conductive layer 210, the first magnetic layer 230, the non-magnetic layer 240, the second magnetic layer 250, and a capping layer 400 configured to cover the variable resistance element 200 and the magnetic spacer 300A. That is, the anti-ferromagnetic layer 220 in the designs in FIGS. 1C and 2 is omitted in FIG. 3, and thus the first magnetic layer 230 forming a magnetization-pinned layer can be directly coupled with the first conductive layer 210.

Figure 4A:
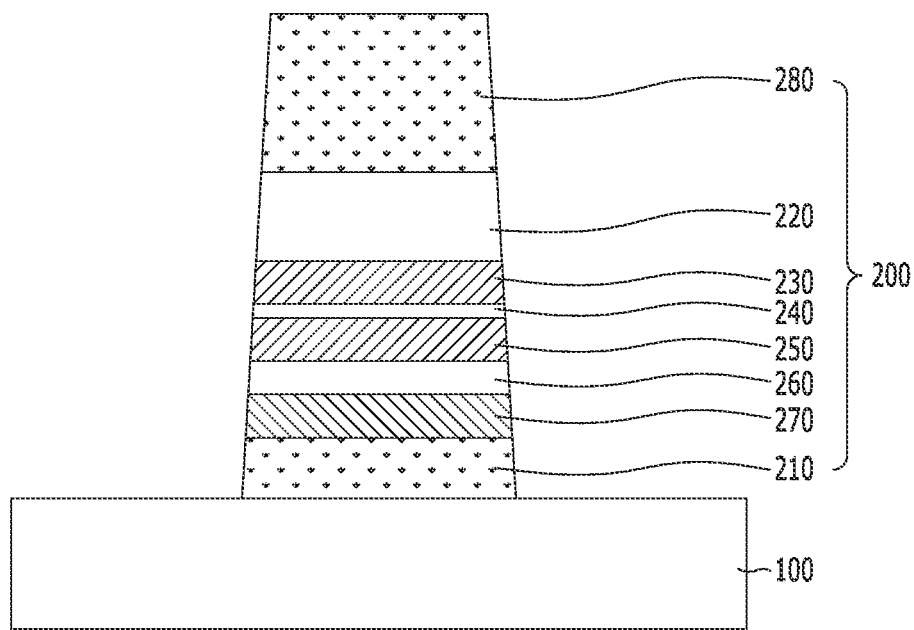
FIGS. 4A to 4C are cross-sectional views illustrating an example of a semiconductor device and a method for fabricating the same in accordance with a fourth implementation of the disclosed technology in this document.
Figure 4B:
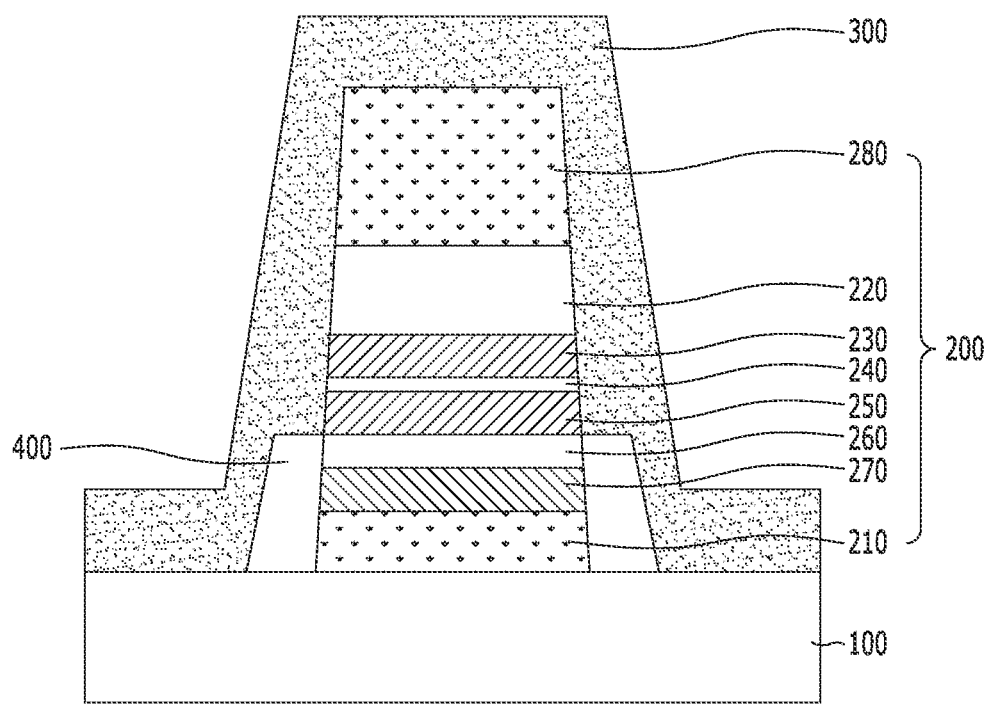
Figure 4C:
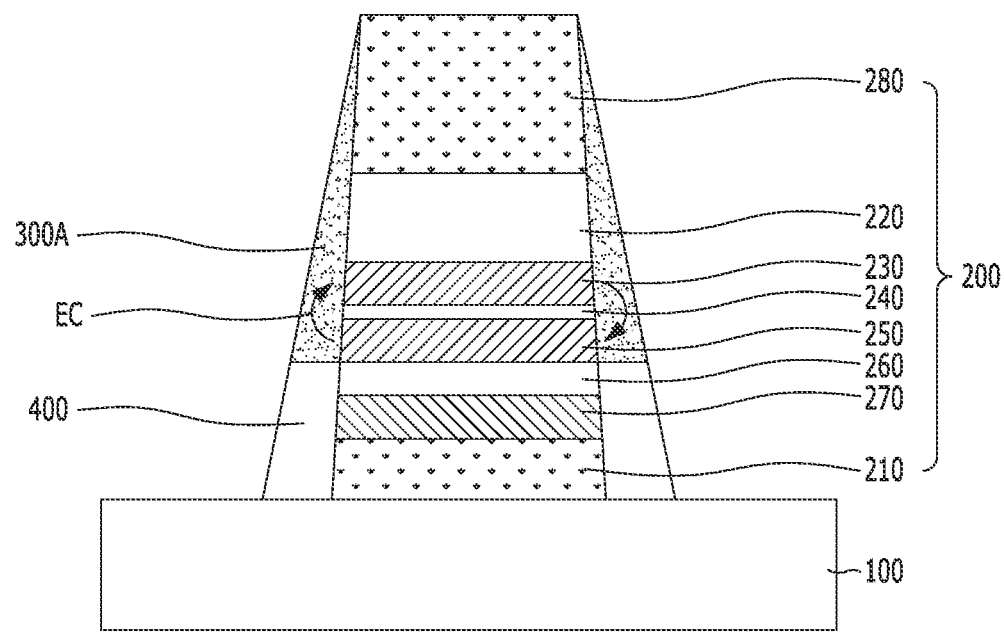

FIGS. 4A to 4C are cross-sectional views illustrating an example of a method for fabricating a semiconductor device in accordance with a fourth implementation of the disclosed technology in this document.

Referring to FIG. 4A, the variable resistance element 200 is formed over the substrate 100 to have the first conductive layer 210, the third magnetic layer 270, the tunnel barrier layer 260, the second magnetic layer 250, the non-magnetic layer 240, the first magnetic layer 230, the anti-ferromagnetic layer 220, and the second conductive layer 280 are sequentially stacked. The substrate 100 may be a semiconductor substrate in which specific underlying structures (not shown) are formed. The variable resistance element 200 can switch between at least two different resistance states due to a change of its electrical resistance in response to voltage or a current that is applied to both ends of the variable resistance element 200. In comparison with the layer sequence in FIGS. 1A and 1C, the sequence of the third magnetic layer 270, the tunnel barrier layer 260, the second magnetic layer 250, the non-magnetic layer 240, the first magnetic layer 230 and the anti-ferromagnetic layer 220 in FIG. 4A is in the reverse sequence of the similar layers in FIGS. 1A and 1C.

In FIG. 4A, each of the first and the second conductive layers 210 and 280 may be a single layer including metal or metal nitride or may be a multiple layer made of or including a combination of various types of the metal or metal nitride. Furthermore, the first, the second, and the third magnetic layers 230, 250, and 270 may include ferromagnetic materials or an alloy of them, and various elements may be added to the ferromagnetic materials or the alloy in order to improve the physical properties of the ferromagnetic materials or the alloy. The first magnetic layer 230 and the second magnetic layer 250 may form a magnetization-pinned layer having a pinned magnetization direction, and the third magnetic layer 270 may be a free magnetization layer having a variable magnetization direction.

The anti-ferromagnetic layer 220 functions to stably pin the magnetization direction of the magnetization-pinned layer and may include anti-ferromagnetic materials. Furthermore, the non-magnetic layer 240 may include non-magnetic and conductive materials that form a magnetization-pinned layer having a synthetic anti-ferromagnetic (SAF) layer structure along with the first and the second magnetic layers 230 and 250. The tunnel barrier layer 260 may include non-magnetic insulating materials that generate a tunneling magnetoresistance (TMR) phenomenon.

Referring to FIG. 4B, the capping layer 400 is formed on the sidewalls of the first conductive layer 210, the third magnetic layer 270, and the tunnel barrier layer 260, and then, a magnetic layer 300 for forming a magnetic spacer is formed on the substrate 100 including the variable resistance element 200. The capping layer 400 may be formed by depositing nitride-series materials on the substrate 100 in which the variable resistance element 200 has been formed and then performing blanket etching on the nitride-series materials. In this case, the capping layer 400 may come in contact with part of the second magnetic layer 250, or part of the tunnel barrier layer 260 may be exposed. Furthermore, the magnetic layer 300 for spacers functions to shield a magnetic field and may include ferromagnetic materials having a high magnetic permeability.

Referring to FIG. 4C, the magnetic spacer 300A is formed on the sidewalls of the second magnetic layer 250, the non-magnetic layer 240, the first magnetic layer 230, the anti-ferromagnetic layer 220, and the second conductive layer 280 by performing blanket etching on the magnetic layer 300 for spacers to and to cover the top part of the stacked structure of the variable resistance element 200 to provide the proper magnetic shielding and to expose the bottom part of so that the layers 210 and 270 in the bottom are free of any contact with the magnetic spacer 300A. The magnetic spacer 300A may be formed over the capping layer 400. A top surface of the second conductive layer 280 may be exposed. In particular, the magnetic spacer 300A can enhance exchange coupling (EC) between the first and the second magnetic layers 230 and 250 and also shield a stray magnetic field from the first and the second magnetic layers 230 and 250.

FIGS. 5A to 5D are cross-sectional views illustrating examples of several circuit configurations of a semiconductor device based on the variable resistance elements have magnetic spacer 300A as described above.

Figure 5A:
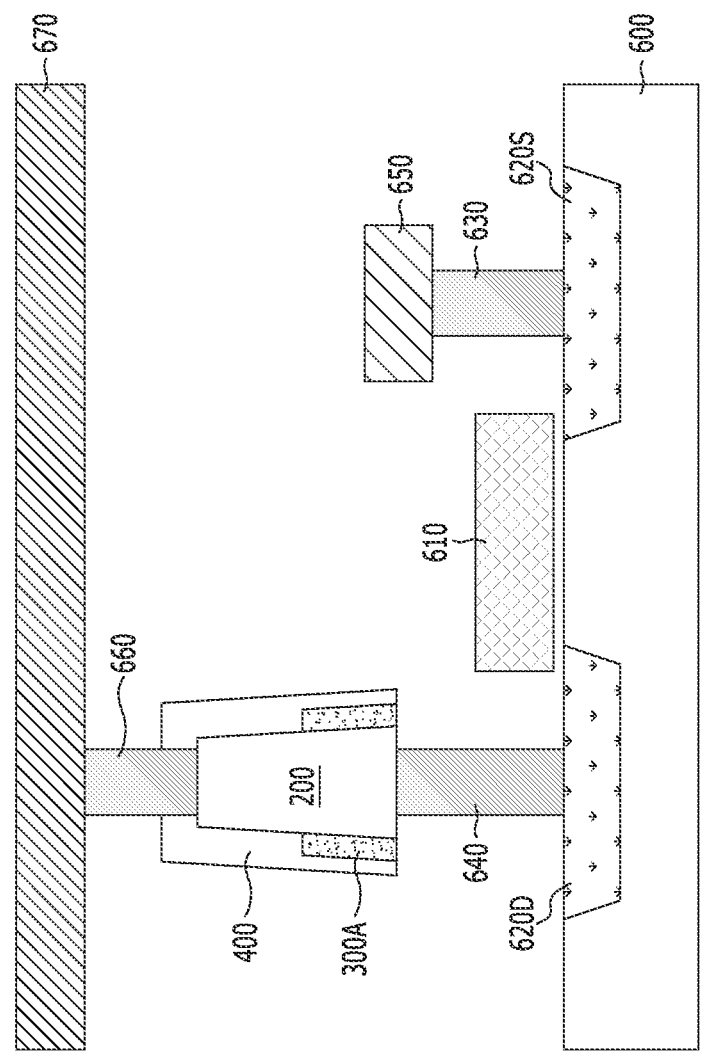
FIGS. 5A to 5D are cross-sectional views illustrating examples of several configurations of a semiconductor device based on the disclosed technology in this document.

Referring to FIG. 5A, a semiconductor device includes the variable resistance element 200 having one end electrically coupled with a transistor and the other end coupled with a bit line 670 through a contact plug 660. The variable resistance element 200 includes a magnetization-pinned layer, a free magnetization layer, and a tunnel barrier layer interposed between the magnetization-pinned layer and the free magnetization layer. The semiconductor device of FIG. 5A includes the magnetic spacer 300A configured to cover part of sidewalls of the variable resistance element 200 by being in contact with the magnetization-pinned layer but without contact with the free magnetization layer. The semiconductor device of FIG. 5A includes the capping layer 400 which covers the variable resistance element 200 and the magnetic spacer 300A.

The transistor is used as a switch configured to perform on/off operations and may be an N-channel metal oxide semiconductor (NMOS) transistor or a P-channel metal oxide semiconductor (PMOS) transistor. Such a transistor may include a gate electrode 610 formed over a substrate 600 and a source region 620S and a drain region 620D formed in the substrate 600 on twosides of the gate electrode 610. A gate insulating layer (not shown) may be interposed between the substrate 600 and the gate electrode 610. The source region 620S may be coupled with a source line 650 through a contact plug 630, and the drain region 620D may be coupled with the variable resistance element 200 through a contact plug 640.

The substrate 600 may be a silicon (Si) substrate, a germanium (Ge) substrate, a silicon-germanium (SiGe) substrate, or a silicon-on-insulator (SOI) substrate. The source region 620S and the drain region 620D may be formed by implanting impurities into the substrate 600 through an ion implantation process. Furthermore, the gate electrode 610, the contact plugs 630, 640, and 660, the source line 650, and the bit line 670 may include conductive materials, such as metal, metal nitride, or doped silicon.

Figure 5B:
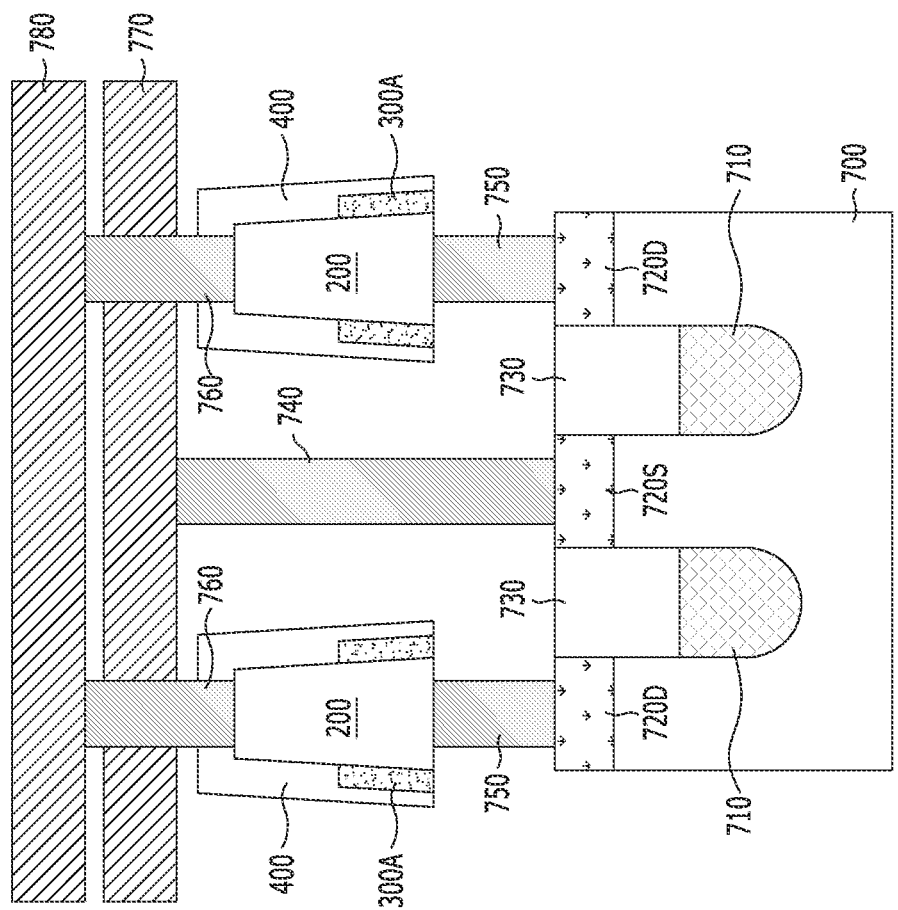

Referring to FIG. 5B, a semiconductor device is provided in which one end of the variable resistance element 200 may be electrically coupled with a transistor having a gate electrode 710 buried in a substrate 700, and the other end of the variable resistance element 200 may be coupled with a bit line 780 through a contact plug 760. A capping layer 730 may be formed over the gate electrode 710, and a source region 720S and a drain region 720D into which impurities have been implanted may be formed in the substrate 700 on two sides of the capping layer 730. The source region 720S may be coupled with a source line 770 through a contact plug 740, and the drain region 720D may be coupled with the variable resistance element 200 through a contact plug 750. In this design, a common source region 720S is shared by two adjacent transistors coupled two adjacent variable resistance elements 200.

The substrate 700 may be a semiconductor substrate including silicon or germanium, and a gate insulating layer (not shown) may be interposed between the substrate 700 and the gate electrode 710. Furthermore, the capping layer 730 may include an oxide layer or nitride-series materials. The gate electrode 710, the contact plugs 740, 750, and 760, the source line 770, and the bit line 780 may include the above-described conductive materials.

Figure 5C:
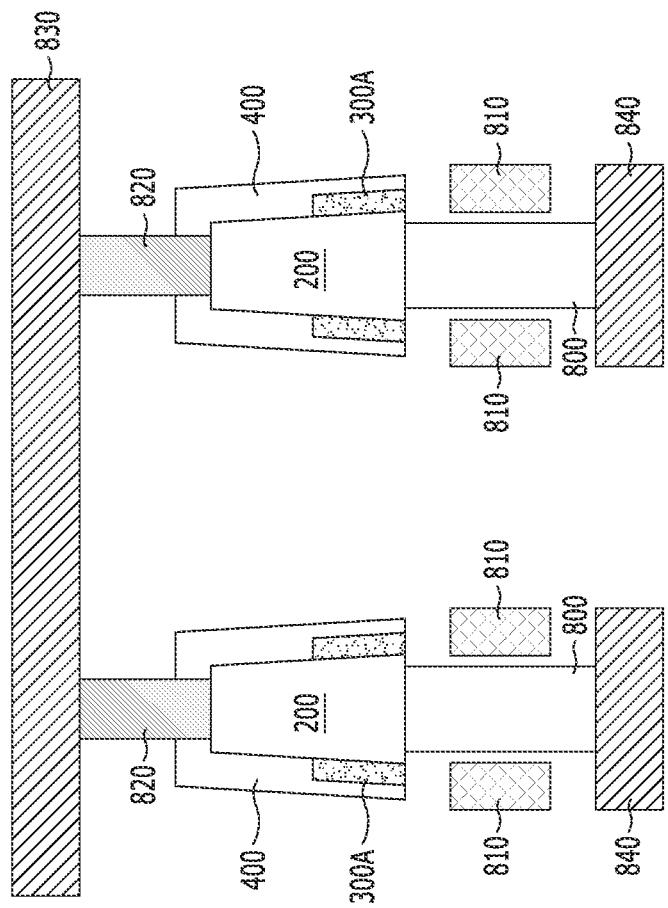

Referring to FIG. 5C, a semiconductor device is provided in which one end of the variable resistance element 200 may be electrically coupled with a transistor having a vertical type channel layer 800, and the other end of the variable resistance element 200 may be coupled with a bit line 830 through a contact plug 820. A gate electrode 810 may come in contact with at least part of the side of the channel layer 800, and a gate insulating layer (not shown) may be interposed between the channel layer 800 and the gate electrode 810. The top of the channel layer 800 may be coupled with the variable resistance element 200, and the bottom of the channel layer 800 may be coupled with a source line 840.

The channel layer 800 may include semiconductor materials, such as silicon or germanium, and junctions (not shown) into which impurities have been implanted may be formed in the top and bottom of the channel layer 800. Furthermore, the gate electrode 810, the contact plug 820, the bit line 830, and the source line 840 may include the above-described conductive materials.

Figure 5D:
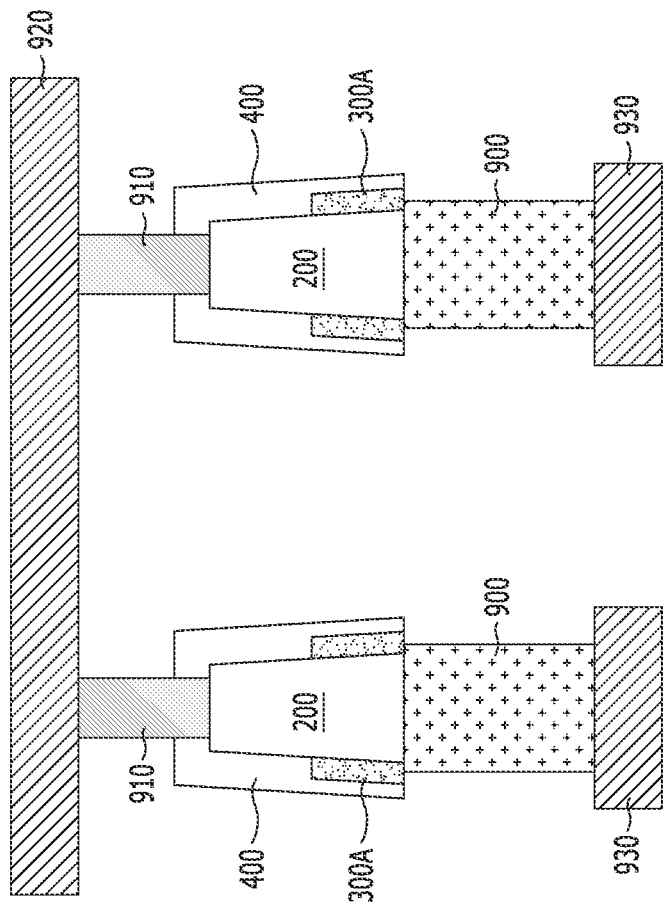

Referring to FIG. 5D, a semiconductor device is provided in which one end of the variable resistance element 200 may be electrically coupled with a selection element 900, and the other end of the variable resistance element 200 may be coupled with a bit line 920 through a contact plug 910. The selection element 900 may be coupled with a word line 930, and the bit line 920 and the word line 930 may extend in a direction crossing the bit line 920 and the word line 930.

The selection element 900 may be a diode, such as a Schottky diode, a PN diode, a PIN diode, or an MIM diode. The selection element 900 may include an asymmetric tunnel barrier, a metal-insulator transition (MIT) element, or an ovonic switching element. Furthermore, the contact plug 910, the bit line 920, and the word line 930 may include the above-described conductive materials.

The above and other memory circuits or semiconductor devices based on the disclosed technology can be used in a range of devices or systems. FIGS. 6-10 provide some examples of devices or systems that can implement the memory circuits disclosed herein.

Figure 6:
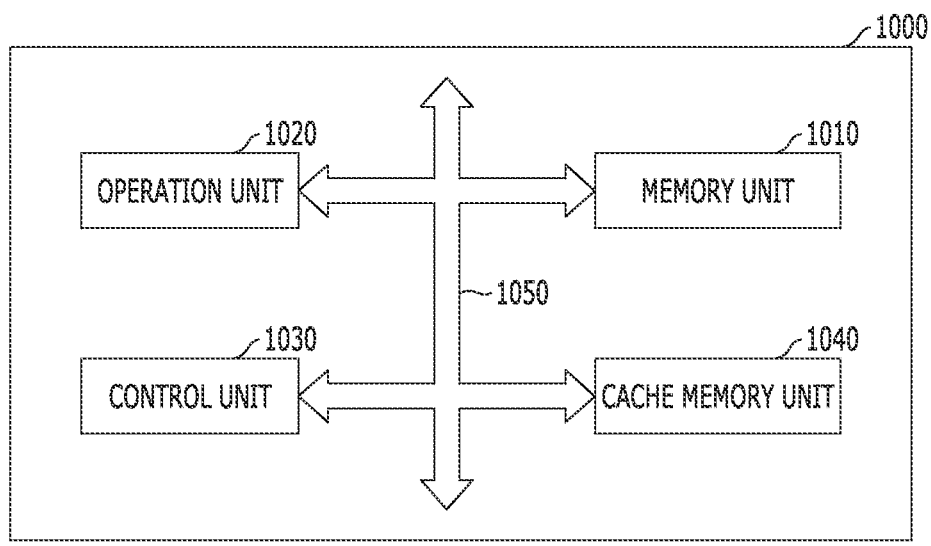
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices.

The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a magnetization-pinned layer configured to include a first magnetic layer, a second magnetic layer, and a non-magnetic layer interposed between the first magnetic layer and the second magnetic layer; a free magnetization layer spaced apart from the magnetization-pinned layer; a tunnel barrier layer interposed between the magnetization-pinned layer and the free magnetization layer; and a magnetic spacer formed on at least a part of a sidewall of the magnetization-pinned layer. Through this, magnetic resistance characteristics of a variable resistance element in the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
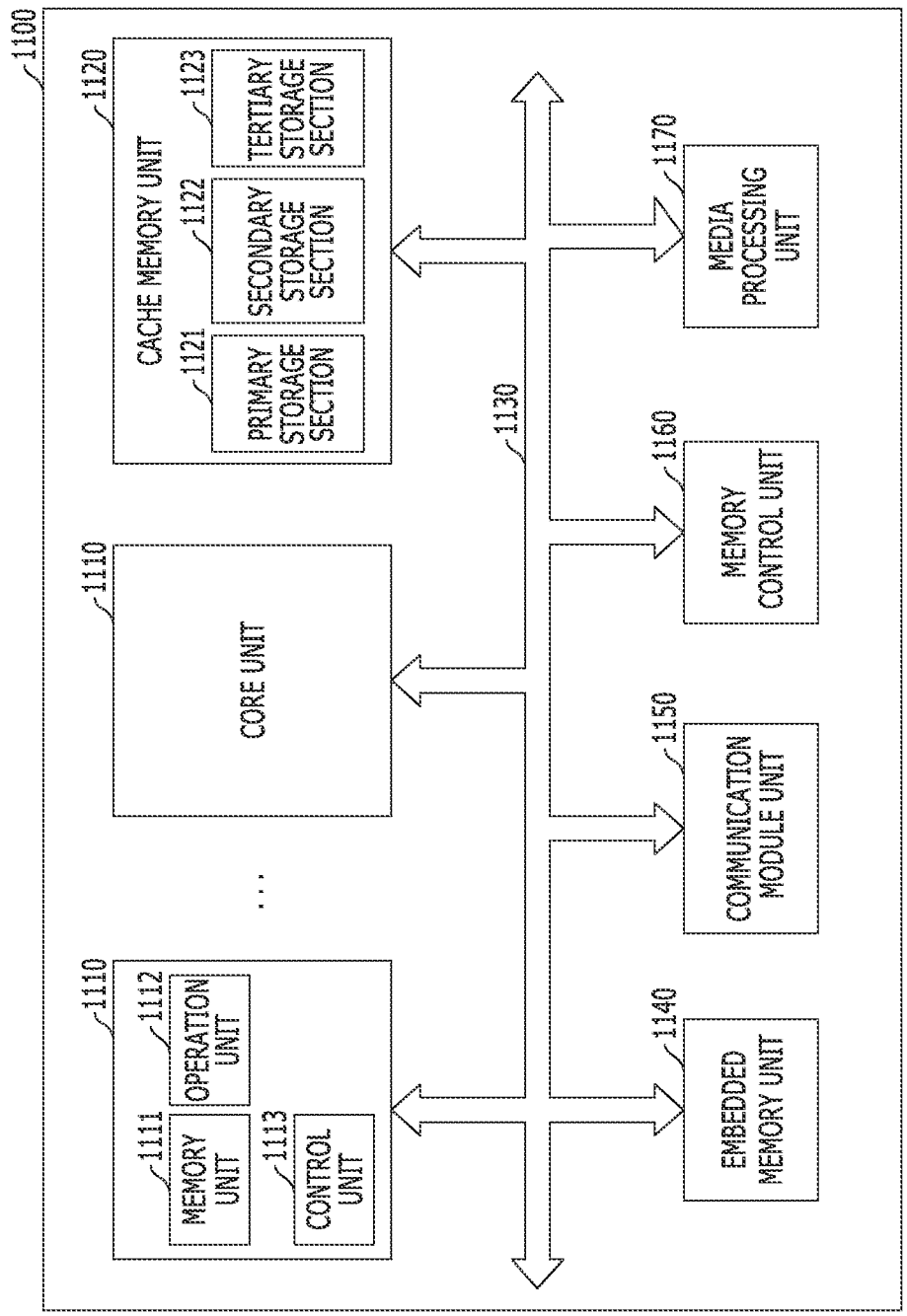
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a magnetization-pinned layer configured to include a first magnetic layer, a second magnetic layer, and a non-magnetic layer interposed between the first magnetic layer and the second magnetic layer; a free magnetization layer spaced apart from the magnetization-pinned layer; a tunnel barrier layer interposed between the magnetization-pinned layer and the free magnetization layer; and a magnetic spacer formed on at least a part of a sidewall of the magnetization-pinned layer. Through this, magnetic resistance characteristics of a variable resistance element in the cache memory unit 1120 may be improved. As a consequence, performance characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
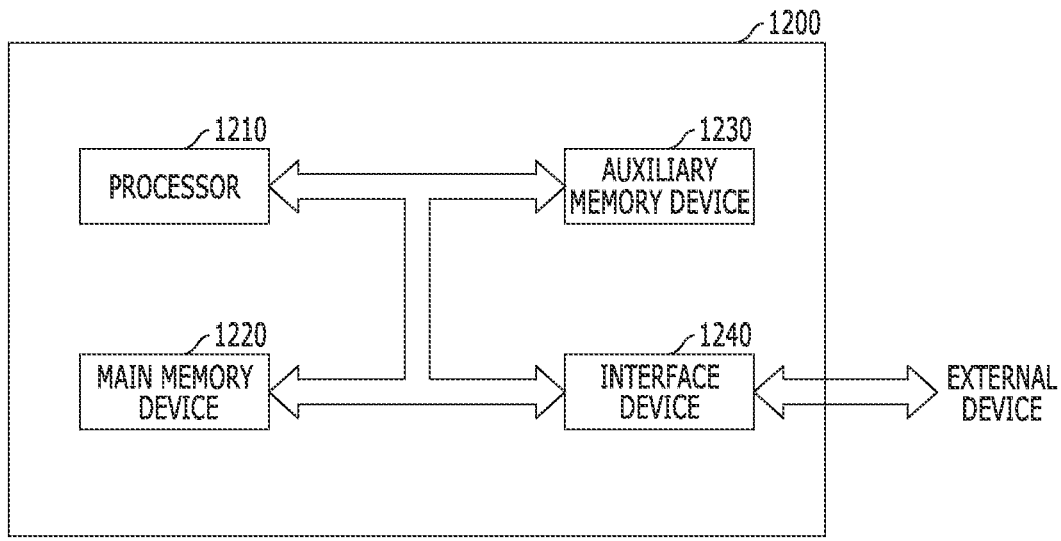
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a magnetization-pinned layer configured to include a first magnetic layer, a second magnetic layer, and a non-magnetic layer interposed between the first magnetic layer and the second magnetic layer; a free magnetization layer spaced apart from the magnetization-pinned layer; a tunnel barrier layer interposed between the magnetization-pinned layer and the free magnetization layer; and a magnetic spacer formed on at least a part of a sidewall of the magnetization-pinned layer. Through this, magnetic resistance characteristics of a variable resistance element in the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a magnetization-pinned layer configured to include a first magnetic layer, a second magnetic layer, and a non-magnetic layer interposed between the first magnetic layer and the second magnetic layer; a free magnetization layer spaced apart from the magnetization-pinned layer; a tunnel barrier layer interposed between the magnetization-pinned layer and the free magnetization layer; and a magnetic spacer formed on at least a part of a sidewall of the magnetization-pinned layer. Through this, magnetic resistance characteristics of a variable resistance element in the auxiliary memory device 1230 may be improved. As a consequence, performance characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
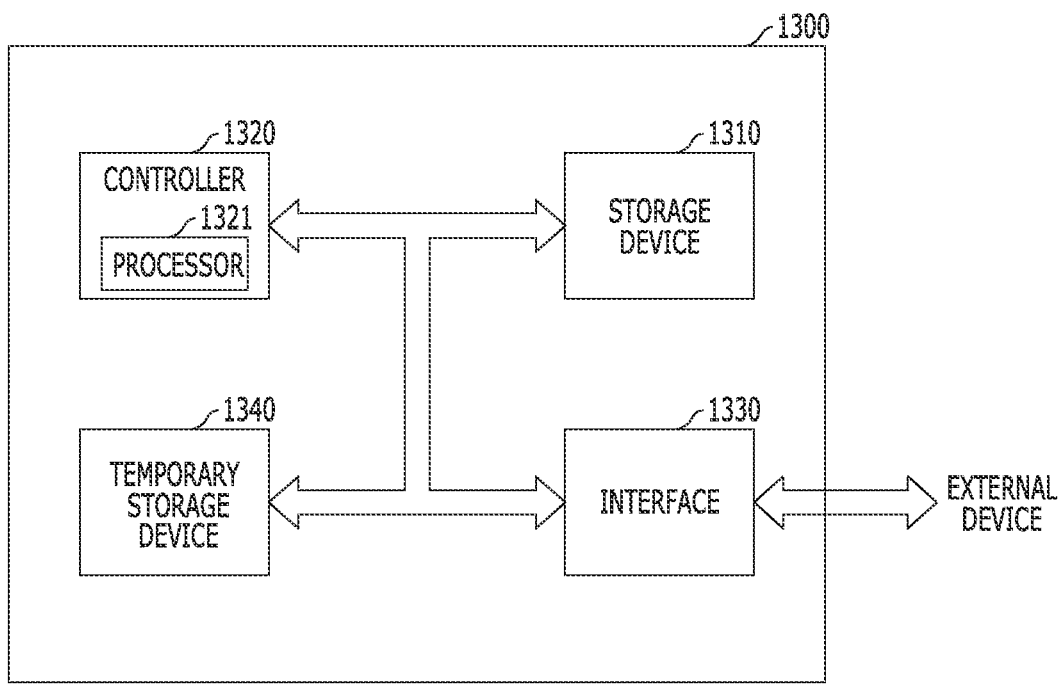
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a magnetization-pinned layer configured to include a first magnetic layer, a second magnetic layer, and a non-magnetic layer interposed between the first magnetic layer and the second magnetic layer; a free magnetization layer spaced apart from the magnetization-pinned layer; a tunnel barrier layer interposed between the magnetization-pinned layer and the free magnetization layer; and a magnetic spacer formed on at least a part of a sidewall of the magnetization-pinned layer. Through this, magnetic resistance characteristics of a variable resistance element in the temporary storage device 1340 may be improved. As a consequence, performance characteristics of the data storage system 1300 may be improved.

Figure 10:
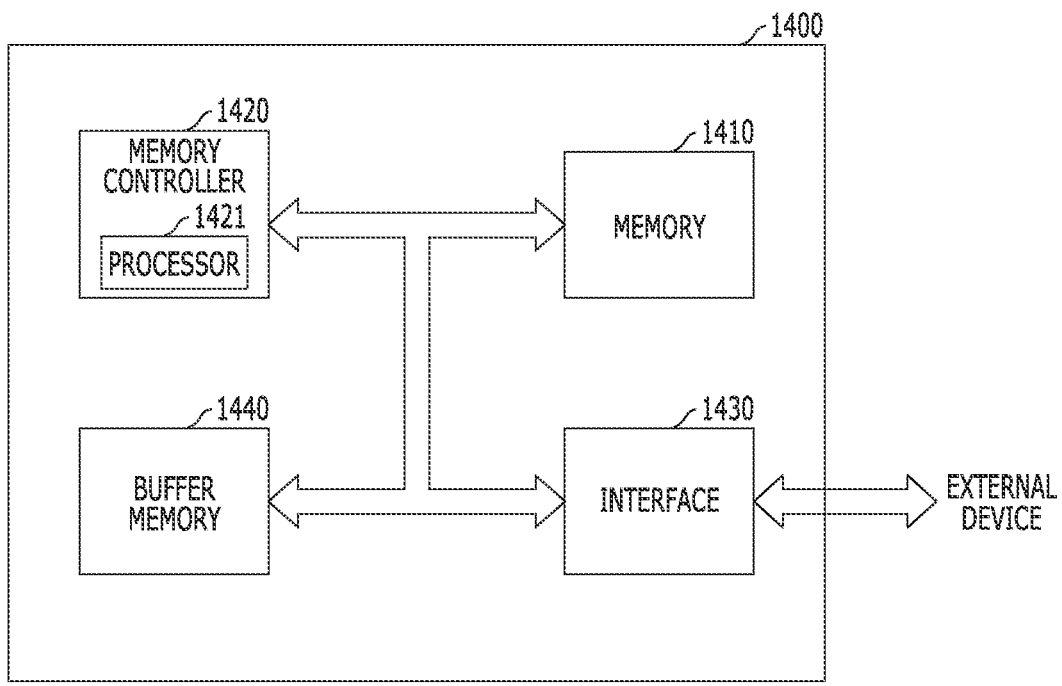
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a magnetization-pinned layer configured to include a first magnetic layer, a second magnetic layer, and a non-magnetic layer interposed between the first magnetic layer and the second magnetic layer; a free magnetization layer spaced apart from the magnetization-pinned layer; a tunnel barrier layer interposed between the magnetization-pinned layer and the free magnetization layer; and a magnetic spacer formed on at least a part of a sidewall of the magnetization-pinned layer. Through this, magnetic resistance characteristics of a variable resistance element in the memory 1410 may be improved. As a consequence, performance characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a magnetization-pinned layer configured to include a first magnetic layer, a second magnetic layer, and a non-magnetic layer interposed between the first magnetic layer and the second magnetic layer; a free magnetization layer spaced apart from the magnetization-pinned layer; a tunnel barrier layer interposed between the magnetization-pinned layer and the free magnetization layer; and a magnetic spacer formed on at least a part of a sidewall of the magnetization-pinned layer. Through this, magnetic resistance characteristics of a variable resistance element in the buffer memory 1440 may be improved. As a consequence, performance characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory includes:
    a magnetization-pinned layer configured to include a first magnetic layer, a second magnetic layer, and a non-magnetic layer interposed between the first magnetic layer and the second magnetic layer;
    a free magnetization layer spaced apart from the magnetization-pinned layer;
    a tunnel barrier layer interposed between the magnetization-pinned layer and the free magnetization layer;
    a magnetic spacer formed to contact at least a part of sidewalls of the magnetization-pinned layer without being in contact with the free magnetization layer; and
    a capping layer formed to include (1) a top capping layer portion over top and sides of a magnetic structure formed by the magnetization-pinned layer, the tunnel barrier layer and the free magnetization layer and (2) side capping layer portions in contact with sidewalls of the free magnetization layer.

2. The electronic device of claim 1, wherein the capping layer is in contact with a top surface and an outer sidewall of the magnetic spacer by the top capping layer portion.

3. The electronic device of claim 1, wherein a top surface of the capping layer is in contact with a bottom surface of the magnetic spacer by the side capping layer portions.

4. The electronic device of claim 1, wherein the magnetic spacer is formed to be in contact with sidewalls of the first magnetic layer and partially cover sidewalls of the second magnetic layer.

5. The electronic device of claim 1, wherein the magnetic spacer is formed to be in contact with at least part of sidewalls of the tunnel barrier layer.

6. The electronic device of claim 1, further comprising an anti-ferromagnetic layer contacting with one surface of the magnetization-pinned layer.

7. The electronic device of claim 6, wherein the magnetic spacer is formed to be in contact with sidewalls of the anti-ferromagnetic layer.

8. The electronic device of claim 1, further comprising:
    a first conductive layer coupled with the magnetization-pinned layer, and
    a second conductive layer coupled with the free magnetization layer.

9. The electronic device of claim 1, wherein the free magnetization layer includes a lower magnetic layer, an upper magnetic layer, and a non-magnetic layer interposed between the lower magnetic layer and the upper magnetic layer.

10. The electronic device of claim 9, wherein a thickness of the non-magnetic layer is set to control an exchange coupling characteristic between the lower magnetic layer and the upper magnetic layer.

11. The electronic device of claim 1, wherein the magnetic spacer includes ferromagnetic materials.

12. The electronic device of claim 1, wherein the magnetic spacer shields a magnetic field from the magnetization-pinned layer.

13. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory is part of the cache memory unit in the processor.

14. The electronic device according to claim 1, further comprising a data storage system which includes:
    a storage device configured to store data and conserve stored data regardless of power supply;
    a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

15. The device as in claim 1, wherein the first magnetic layer, the second magnetic layer and the free magnetization layer include ferromagnetic materials.

16. The device as in claim 1, wherein the capping layer includes an oxide layer or nitride-series materials.

17. An electronic device comprising a semiconductor memory which includes:

a substrate; and an array of memory cells over the substrate, each memory cell including a variable resistance element and a switching circuit element coupled to the variable resistance element to select the variable resistance element, wherein each variable resistance element includes a stacked structure including a magnetization-pinned layer exhibiting a magnetization that is pinned to a fixed direction, a free magnetization layer separated from the magnetization-pinned layer and structured to exhibit a variable magnetization that is changeable in response to an applied control signal and a tunnel barrier layer interposed between the magnetization-pinned layer and the free magnetization layer, and wherein each variable resistance element further includes a magnetic spacer in contact with a side wall of the stacked structure, the magnetic spacer structured to be in contact with at least part of the sidewall of the magnetization-pinned layer without being in contact with the free magnetization layer to provide shielding of the free magnetization layer from a stray magnetic field produced by the magnetization-pinned layer, and each variable resistance element further includes a capping layer to include (1) a top capping layer portion over top and sides of a magnetic structure formed by the magnetization-pinned layer, the tunnel barrier layer and the free magnetization layer and (2) side capping layer portions in contact with sidewalls of the free magnetization layer and a portion of the magnetic spacer.

18. The device as in claim 17, wherein:

the magnetic spacer has a varying thickness along the sidewall of the stacked structure.

19. The device as in claim 17, wherein:

the free magnetization layer is closer to the substrate than the magnetization-pinned layer in each stacked structure, and the magnetic spacer is free of a contact with the substrate.

20. The device as in claim 17, wherein:

the magnetization-pinned layer is closer to the substrate than the free magnetization layer in each stacked structure, and the magnetic spacer is in contact with the substrate.

21. The device as in claim 17, wherein the magnetization-pinned layer includes a first magnetic layer, a second magnetic layer, and a non-magnetic layer interposed between the first magnetic layer and the second magnetic layer.

22. The device as in claim 17, wherein each variable resistance element has a resistance state depending on the magnetization directions of the magnetization-pinned layer and the free magnetization layer.

* * * * *